United States Patent
Sugano

(10) Patent No.: US 8,637,336 B2
(45) Date of Patent: Jan. 28, 2014

(54) METHOD FOR PRODUCING SEMICONDUCTOR WAFER

(75) Inventor: Susumu Sugano, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 13/574,186

(22) PCT Filed: Jan. 14, 2011

(86) PCT No.: PCT/JP2011/050533
§ 371 (c)(1),
(2), (4) Date: Jul. 19, 2012

(87) PCT Pub. No.: WO2011/089979
PCT Pub. Date: Jul. 28, 2011

(65) Prior Publication Data
US 2012/0295383 A1  Nov. 22, 2012

(30) Foreign Application Priority Data
Jan. 20, 2010  (JP) .................................. 2010-010500

(51) Int. Cl.
*H01L 21/00* (2006.01)

(52) U.S. Cl.
USPC .......................................................... 438/46

(58) Field of Classification Search
None
See application file for complete search history.

(56) References Cited

U.S. PATENT DOCUMENTS

2010/0065855 A1  3/2010 Yokoyama et al.

FOREIGN PATENT DOCUMENTS

| JP | 63-150130 A | 6/1988 | |
| JP | 11-277413 A | 10/1999 | |
| JP | 11277413 A * | 10/1999 | .............. B24B 37/04 |
| JP | 2003-347255 A | 12/2003 | |
| JP | 2003347255 A * | 12/2003 | ............ H01L 21/304 |
| JP | 2008-177525 A | 7/2008 | |
| JP | 2008177525 A * | 7/2008 | |
| JP | 2009-70896 A | 4/2009 | |
| JP | 2009070896 A * | 4/2009 | |

OTHER PUBLICATIONS

Machine translation of JP 2009070896.*
Machine translation of JP 11277413.*
Machine translation of JP 2003347255.*
Machine translation of JP JP 2008177525.*
International Search Report for PCT/JP2011/050533 dated Feb. 22, 2011.

* cited by examiner

*Primary Examiner* — Charles Garber
*Assistant Examiner* — Syed Gheyas
(74) *Attorney, Agent, or Firm* — Sughrue Mion, PLLC

(57) ABSTRACT

A method of producing a semiconductor wafer, which includes: placing a wafer (10) provided with a substrate (11) and a semiconductor layer (20) formed thereon, on a carrier plate (fixing plate) (31) of a grinder via fixing wax (33a and 33b) such that the surface (10a) to be ground faces upward; heating the carrier plate to soften the fixing wax; pressure-contacting the wafer from the side of the surface (10a) to be ground using an air bag such that a portion of the softened fixing wax spreads and protrudes from the peripheral edge of the wafer; cooling the carrier plate while applying pressure to cure the fixing wax and fix the wafer onto the carrier plate; and rotating the surface (10a) to be ground of the fixed wafer while pressure-contacting the surface (10a) to the grinding plate of the grinder, thereby grinding the surface (10a) to be ground.

8 Claims, 4 Drawing Sheets

METHOD FOR PRODUCING SEMICONDUCTOR WAFER

TECHNICAL FIELD

The present invention relates to a method for producing a semiconductor wafer. In particular, the present invention relates to a method for producing a semiconductor wafer that grinds a semiconductor light emitting element wafer or a semiconductor light receiving element wafer to have a predetermined thickness even if the wafer has warping.

BACKGROUND ART

In general, the semiconductor light emitting element is prepared as a light emitting element chip by forming a compound semiconductor layer such as a group III-V compound semiconductor layer on a substrate made of sapphire or the like, further providing an anode, a cathode and the like, then grinding and polishing a surface-to-be-ground of the substrate, and thereafter cutting into an appropriate shape (refer to Patent Document 1).

CITATION LIST

Patent Literature

Patent Document 1: Japanese Patent Application Laid-Open Publication No. 2008-177525

SUMMARY OF INVENTION

Technical Problem

Incidentally, in the case of grinding and polishing a wafer, a surface-to-be-ground is ground by attaching the wafer onto a fixing plate of a predetermined grinder by use of a fixing wax, and thereafter, rotating the wafer while causing the wafer to pressure-contact a grinding plate of the grinder with a predetermined pressure. On this occasion, if the wafer has warping, the fixing wax does not spread uniformly; therefore, there are some cases where, if plural wafers are placed on one grinder, difference in height occurs within a wafer or among wafers. In particular, it is known that a wafer tends to have warping in the case of a semiconductor light emitting element using a sapphire single crystal as a substrate due to formation of a compound semiconductor layer on the substrate.

An object of the present invention is, in a method for producing a semiconductor wafer, to grind the wafer to have a predetermined thickness even if the wafer has warping.

Solution to Problem

Namely, according to the present invention, the following [1] to [6] are provided.

[1] A method for producing a semiconductor wafer, including: a placing step in which a semiconductor wafer including a substrate and a semiconductor layer formed on the substrate is placed, with a surface-to-be-ground of the semiconductor wafer facing upward, on a fixing plate of a grinder via a fixing wax; a heating step in which the fixing plate on which the semiconductor wafer is placed in the placing step is heated to soften the fixing wax; a pressure-contact bonding step in which, in a state where the fixing wax is softened in the heating step, the semiconductor wafer is brought into pressure-contact from a side of the surface-to-be-ground by an air bag and bonded onto the fixing plate; a fixing step in which the fixing plate is cooled while the semiconductor wafer bonded onto the fixing plate in the pressure-contact bonding step is pressurized, and thereby the semiconductor wafer is fixed onto the fixing plate by curing the fixing wax; and a grinding step in which the surface-to-be-ground of the semiconductor wafer fixed onto the fixing plate is rotated while being in pressure-contact with a grinding plate of the grinder to be ground.

[2] The method for producing a semiconductor wafer according to the above [1], wherein, in the fixing step, a rubber-like elastic body sheet is placed on the surface-to-be-ground of the semiconductor wafer, and the semiconductor wafer is pressurized via the rubber-like elastic body sheet.

[3] The method for producing a semiconductor wafer according to the above [1], wherein, in the placing step, the semiconductor wafer is placed on the fixing plate via a fixing sheet and the fixing wax.

[4] The method for producing a semiconductor wafer according to the above [3], wherein the fixing sheet is configured with tissue paper or a nonwoven fabric.

[5] The method for producing a semiconductor wafer according to the above [1], wherein the substrate is selected from sapphire or silicon.

[6] The method for producing a semiconductor wafer according to the above [1], wherein the semiconductor layer of the semiconductor wafer is formed by laminating an n-type semiconductor layer, a light emitting layer and a p-type semiconductor layer that include a group III nitride semiconductor.

Advantageous Effects of Invention

According to the present invention, even in a case of a semiconductor wafer with a group III nitride semiconductor layer on a substrate having warping, it is possible to grind the semiconductor wafer to have a predetermined thickness without causing a thickness defect (out of specification) of the semiconductor wafer.

Especially, even in a case where the wafer has large warping, since the wafer is subjected to pressure-contact by an air bag from the side of the surface-to-be-ground, a fixing wax softened in a heating step can uniformly spread from the center portion toward the peripheral edge portion of the wafer. Accordingly, it is possible to make the thickness of the wax uniform and to grind the wafer to have a predetermined thickness.

DESCRIPTION OF EMBODIMENTS

Hereinbelow, an exemplary embodiment according to the present invention will be described in detail. It should be noted that the present invention is not limited to the following exemplary embodiment, but may be practiced as various modifications within the scope of the gist of the invention. Further, each of the figures to be used indicates an example for illustration of the exemplary embodiment, and does not represent an actual size thereof.

FIG. 1 is diagrams for illustrating a method for producing a semiconductor wafer to which the exemplary embodiment is applied. It should be noted that the semiconductor wafer according to the present invention includes a semiconductor light emitting element wafer, a semiconductor light receiving element wafer, or the like.

In general, the semiconductor wafer is prepared by attaching a wafer, in which a semiconductor layer and electrodes or the like are provided on a substrate, onto a predetermined grinder, and grinding and polishing a surface-to-be-ground of the wafer. In the exemplary embodiment, the wafer is attached to a grinder according to the following operation.

Figure 1A:
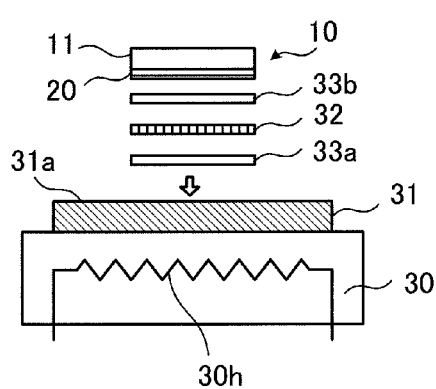
FIG. 1 is diagrams for illustrating an example of a method for producing a semiconductor wafer to which the exemplary embodiment is applied.

First, as shown in FIG. 1A, a carrier plate (fixing plate) 31 of a grinder (not shown) to be described later is placed on a heating stage 30 with a built-in heater 30h. Next, a fixing wax 33a, a fixing sheet 32 and a fixing wax 33b are laminated in this order on a plate surface 31a of the carrier plate 31, and further, a wafer 10 is placed thereon (placing step). In the exemplary embodiment, the wafer 10 has, for example, a semiconductor layer 20 constituted by a group III nitride semiconductor formed on a substrate 11 made of sapphire. At this time, the wafer 10 is placed with a surface-to-be-ground 10a facing up. The fixing waxes 33a and 33b are uniformly applied by, for example, a spin coater or the like. It should be noted that the fixing sheet 32, the fixing waxes 33a and 33b will be described later. In some cases, the fixing waxes 33a and 33b are collectively referred to as a fixing wax 33.

In the exemplary embodiment, the heating stage 30 is normally heated by the heater 30h to a temperature higher than a softening point of a resin, which is a main ingredient of the fixing waxes 33a and 33b, by about 20° C. to 50° C. (heating step). Moreover, by heating, volatiles such as a solvent included in the fixing waxes 33a and 33b are volatilized. It should be noted that, in the exemplary embodiment, the carrier plate 31 is made of ceramics.

Figure 1B:
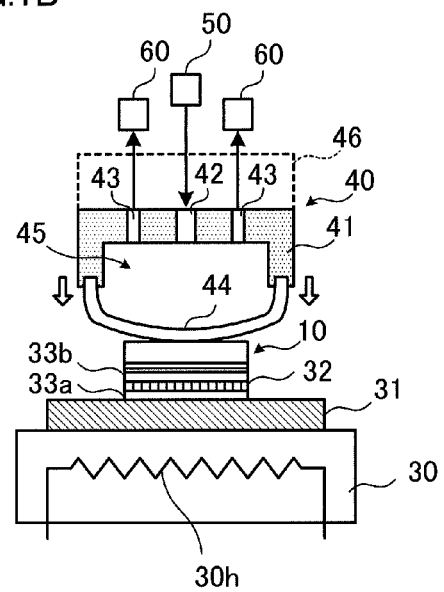

Subsequently, as shown in FIG. 1B, the wafer 10 is subjected to pressure-contact from the surface-to-be-ground 10a side by an air bag, to thereby spread the fixing waxes 33a and 33b that have been softened in the heating step from the center portion to the peripheral portion of the wafer 10.

Here, a pressure-contact member 40 is configured with a main body 41 and an elastic member 44 provided below the main body 41. The main body 41 and the elastic member 44 form a pressure chamber 45, which is a closed space as the air bag. By a pressurized fluid supply unit 50 having an air compressor and the like, pressurized fluid such as pressurized air is supplied to the pressure chamber 45 from a supply communicating path 42 that communicates with the pressure chamber 45, and thereby a uniform load is applied to the elastic member 44. By application of uniform load, it is possible to make the thickness of the waxes uniform and prevent occurrence of the thickness defect in the wafer 10 after grinding.

The pressure in the pressure chamber 45 is finely adjusted by adjusting a flowing amount of pressurized air discharged by plural discharge communicating paths 43 provided in the main body 41 by a pressurized fluid discharge unit 60 that discharges the pressurized fluid. As a material constituting the elastic body 44, for example, synthetic rubber or the like is provided, and specifically, silicone rubber or the like is provided. Further, the pressure-contact member 40 has a pressure-contact unit 46 placed on a top surface of the pressure-contact member 40. The pressure-contact unit 46 is configured with, for example, a weight, and brings the wafer 10 into pressure-contact with the carrier plate 31 via the pressure-contact member 40.

As specific operations, first, a predetermined vertical movement unit (not shown) is actuated to cause the pressure-contact member 40 to move down, and brings the elastic member 44 provided below the main body 41 into contact with the wafer 10. At this time, a shaft center of the pressure-contact member 40 and a shaft center of the wafer 10 are adjusted to coincide with each other. Next, the weight as the pressure-contact unit 46 is placed on the top surface of the pressure-contact member 40. Subsequently, pressurized air of a predetermined pressure is supplied to the pressure chamber 45 by the pressurized fluid supply unit 50, to thereby apply the uniform load to the elastic member 44. Magnitude of the load is appropriately selected in accordance with the diameter of the substrate 11 of the wafer 10 and is not particularly limited; however, in the exemplary embodiment, in the case where the diameter of the substrate 11 is 4 inches to 6 inches, the load is normally in a range of 40 kg/cm$^2$ to 100 kg/cm$^2$.

Figure 1C:
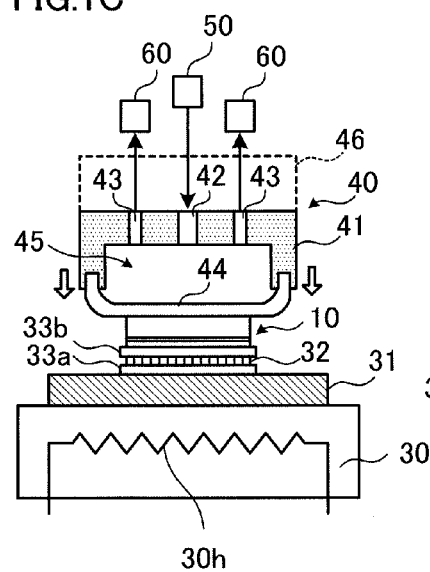

In the exemplary embodiment, the pressure in the pressure chamber 45 is increased by adjusting the pressurized fluid supply unit 50 and the pressurized fluid discharge unit 60. When the pressure in the pressure chamber 45 is increased, a positive pressure from the inside toward the outside of the pressure chamber 45 in which airtightness is kept is applied to the elastic member 44 attached below the main body 41. Therefore, the elastic member 44 is deformed so that a center portion thereof protrudes to the outside of the pressure chamber 45 in the state of being attached to the main body 41, to thereby press the wafer 10 that is in contact with the elastic member 44. At this time, in the softened fixing waxes 33a and 33b on the carrier plate 31, a load is applied from the center portion toward the peripheral portion of the fixing waxes 33a and 33b. As a result, as shown in FIG. 1C, the fixing waxes 33a and 33b applied onto the carrier plate 31 extend substantially uniformly, and a part thereof spreads so as to extend off the peripheral portion of the wafer 10.

Such operations are repeated to bond plural wafers 10 onto the carrier plate 31 by pressure-contact (pressure-contact bonding step).

Figure 1D:
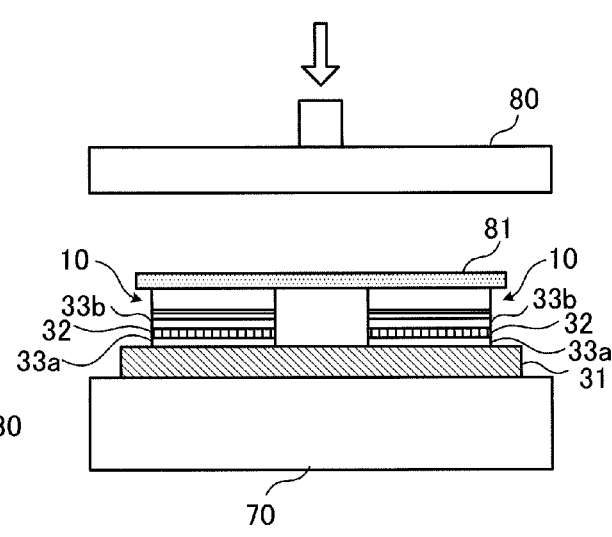

Subsequently, after the plural (normally, three to four) wafers 10 are bonded onto the carrier plate 31, the carrier plate 31 is moved from the heating stage 30 to a press stage 70 of a presser as shown in FIG. 1D, and before the fixing waxes 33a and 33b having been softened and liquidized are cooled and cured, a pressurizing member 80 is caused to move down from above to apply pressure to the plural wafers 10. Then, the carrier plate 31 is cooled by cooling the press stage 70, to thereby cure the fixing waxes 33a and 33b. Consequently, the plural wafers 10 are fixed onto the carrier plate 31 (fixing step). In the embodiment, the press stage 70 is cooled to, for example, the order of about 10° C. to about 20° C. by, for example, cooling water, chilled water or the like.

In addition, in the exemplary embodiment, when the plural wafers 10 having been bonded by the presser onto the carrier plate 31 are pressurized, a rubber-like elastic body sheet 81 is placed between the plural wafers 10 and the pressing member 80 of the presser. As a material of the rubber-like elastic body sheet 81, for example, synthetic rubber or the like is provided, and specifically, silicone rubber or the like is provided. The size of the rubber-like elastic body sheet 81 may be of the order of covering all of the plural wafers 10 bonded onto the carrier plate 31 and is not particularly limited, and the diameter thereof is the order of the diameter of the carrier plate 31.

The thickness of the rubber-like elastic body sheet 81 is not particularly limited, and is of the order of 0.2 mm to 20 mm in the exemplary embodiment.

If the rubber-like elastic body sheet 81 is used in applying pressure to the plural wafers by the presser, even though the heights of the plural wafers 10 bonded onto the carrier plate 31 are different, application of pressure by the pressing member 80 is dispersed by the rubber-like elastic body sheet 81, and there is a tendency to uniformly apply pressure to each of the plural wafers 10.

Next, a grinding method of the wafer 10 will be described.

Figure 2:
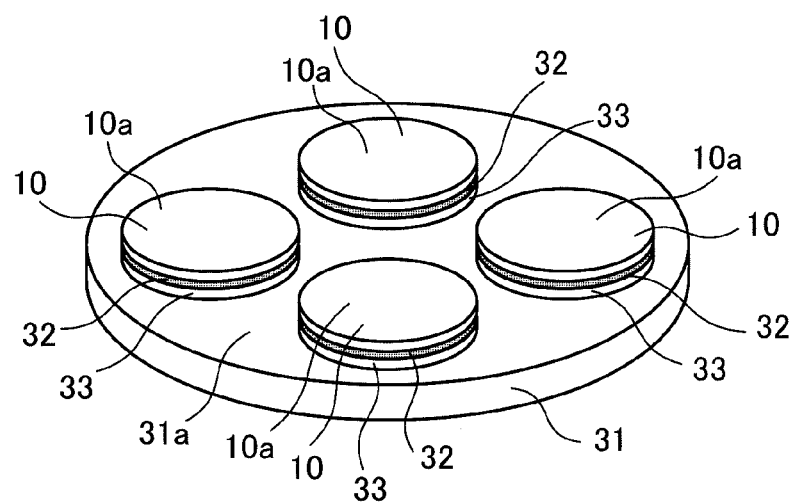
FIG. 2 is a diagram illustrating a state where plural wafers are fixed on a carrier plate of a grinder.

FIG. 2 is a diagram illustrating a state where plural wafers 10 are fixed on the carrier plate (fixing plate) 31 of a grinder (not shown). Four wafers 10, which have been formed by laminating the semiconductor layer 20 (refer to FIG. 1) composed of a group III nitride semiconductor on the substrate 11, as has been described by use of FIG. 1, are fixed onto the plate surface 31a of the carrier plate 31 that is formed into a disc shape via the fixing sheet 32 and the fixing waxes (fixing agent) 33. The four wafers 10 are fixed onto a concentric circle on the plate surface 31a so that the surface-to-be-ground 10a is exposed (in FIG. 2, facing upwardly).

Figure 3:
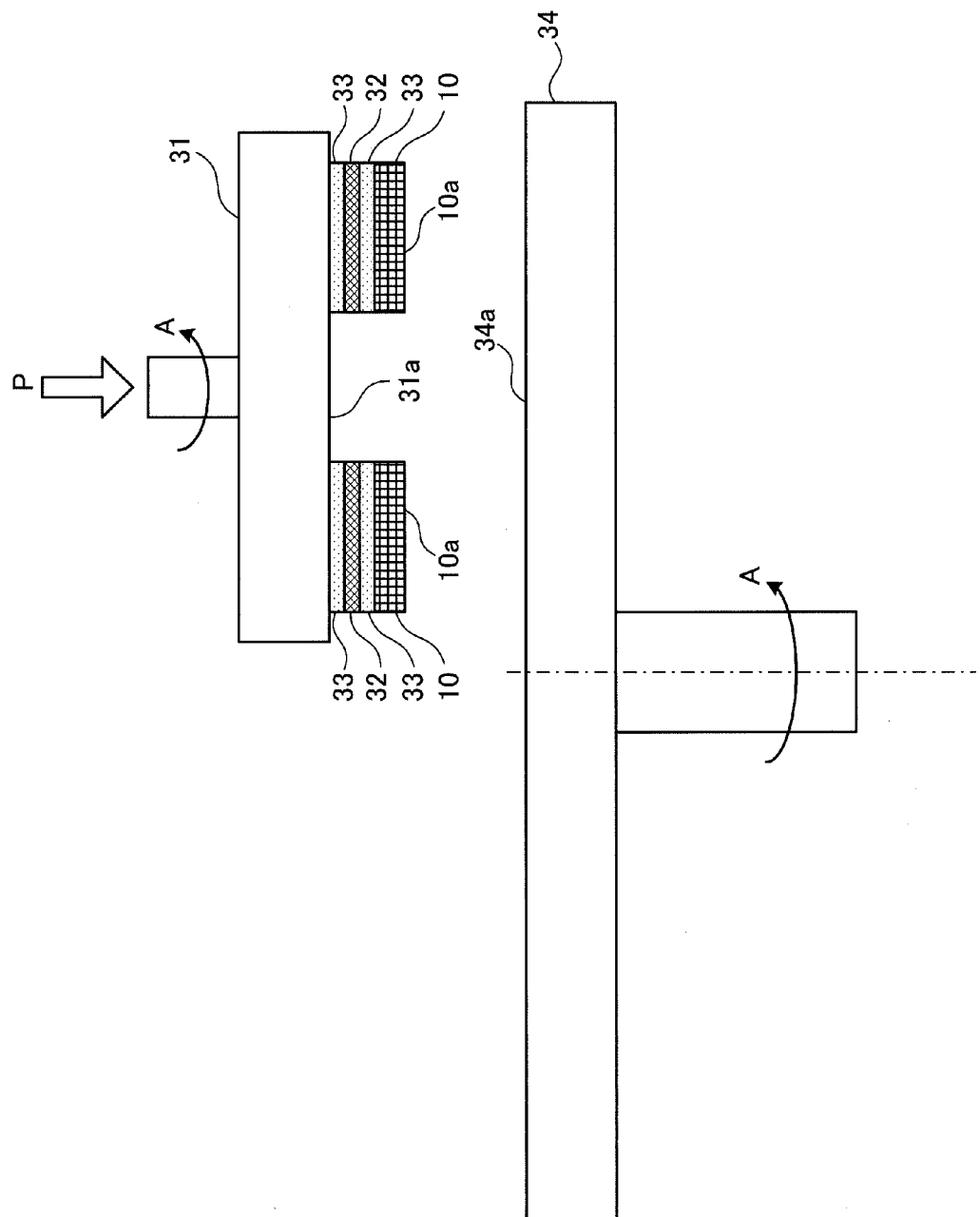
FIG. 3 is a diagram illustrating a state where the carrier plate on which the wafers are fixed is placed on a grinding surface of a grinding plate.

Next, FIG. 3 is a diagram illustrating a state where the carrier plate 31 on which the wafers 10 are fixed is placed on a grinding surface 34a of a grinding plate 34.

As shown in FIG. 3, the surfaces-to-be-ground 10a of the wafers 10 and the grinding surface 34a of the grinding plate 34 are faced, and the carrier plate 31 on which the wafers 10 are fixed is mounted on a pressure-contact mechanism (not shown).

Subsequently, the carrier plate 31 is caused to move down by the predetermined vertical movement mechanism (not shown), the surfaces-to-be-ground 10a of the wafers 10 are brought into contact with the grinding surface 34a of the grinding plate 34, and the surfaces-to-be-ground 10a of the wafers 10 are caused to pressure-contact the grinding surface 34a at a pressure P by the pressure-contact mechanism.

In the exemplary embodiment, the pressure P is adjusted within a range of 70 kg/cm$^2$ to 100 kg/cm$^2$ to apply pressure to the wafers 10, and the surfaces-to-be-ground 10a of the wafers 10 are bought into pressure-contact with the grinding surface 34a.

Then, the carrier plate 31 and the grinding plate 34 are rotated in a direction A by a predetermined rotational driving mechanism (not shown), to thereby grind the surface-to-be-ground 10a of each wafer 10 (grinding step).

In the exemplary embodiment, the surfaces-to-be-ground 10a of the wafers 10 are ground by the grinding step of the order of about 5 minutes to about 120 minutes, and thereby the thickness of the substrate 11 (refer to FIG. 1) of the wafer 10 is reduced from about 1000 μm to about 120 μm. Further, in the exemplary embodiment, subsequent to the grinding step, the thickness of the substrate 11 (refer to FIG. 1) of the wafer 10 is polished down from about 120 μm to about 80 μm by a polishing step of the order of about 5 minutes to about 30 minutes.

In the exemplary embodiment, kinds of grindstones constituting the grinding plate 34 are not particularly limited, and commercially available grindstones may be used. Moreover, kinds of abrasives to be supplied when polishing is performed are not particularly limited, and commercially available slurry-type abrasives may be used.

It should be noted that heat is generated in grinding processing of the surfaces-to-be-ground 10a of the wafers 10 that have been bonded and fixed onto the plate surface 31a; however, the wafers 10 do not peel off by such heat.

Moreover, though not shown, the grinder includes four carrier plates 31 in total, each of which has four wafers 10 bonded thereon, and performs grinding and polishing of the surfaces-to-be-ground 10a of the wafers 10 fixed onto the carrier plates 31 while being rotated by the predetermined rotational driving mechanism (not shown).

(Fixing Waxes 33a and 33b)

Next, the fixing waxes 33a and 33b will be described.

As the fixing waxes 33a and 33b, there is no particular limitation as long as a material is capable of tentatively holding and fixing the wafers 10 onto the carrier plate 31 during the grinding step, and further, capable of allowing the wafers 10 to be easily peeled off from the carrier plate 31 after the grinding step. As such fixing waxes 33a and 33b, for example, a vinyl-based polymeric compound, a petroleum resin, a natural resin, such as rosin, and a derivative thereof, a resin having thermoplasticity such as a paraffin wax and the like, fatty acid ester of polyglycerol, ethylene oxide of polyglycerol, or a propylene oxide adduct can be provided.

Moreover, as rosin in particular, rosin with a three-membered ring compound represented by an abietic acid (monocarboxylic acid having a molecular formula $C_{20}H_{30}O_2$) as the main ingredient, partial ester of rosin, partially or completely hydrogenated rosin, polymerized rosin, disproportionated rosin, dibasic acid modified rosin, which is a modification of rosin and a dibasic acid represented by a maleic acid, and a derivative such as ester thereof can be provided. Further, styrene-acrylic acid copolymer resin or the like can be provided.

These resins can be used alone or in combination of at least two kinds thereof.

(Fixing Sheet)

Next, the fixing sheet 32 will be described.

As shown in FIG. 1, in the exemplary embodiment, the wafer 10 formed by laminating the semiconductor layer 20 (refer to FIG. 1) composed of a group III nitride semiconductor on the substrate 11 is bonded onto the plate surface 31a of the carrier plate 31 via the fixing sheet 32 and the fixing waxes 33a and 33b.

As the fixing sheet 32, tissue paper or a nonwoven fabric can be provided. Here, the tissue paper refers to machine made Japanese paper being compliant with JIS P4500. Moreover, the nonwoven fabric refers to a sheet made by bonding fibers without weaving or knitting. As the nonwoven fabric, those constituted by natural fibers such as cotton, hemp, wool fibers, palm fibers and coconut fibers; synthesized fibers such as polyamide, polyester, polypropylene, polyethylene, polyacrylonitrile and polyurethane; or inorganic fibers such as glass fibers, carbon fibers and metal fibers can be provided.

In the exemplary embodiment, it is preferable that the fixing sheet 32 is constituted by the tissue paper whose basis weight based on JIS P8124 is in a range of 3 g/m$^2$ to 150 g/m$^2$, preferably in a range of 4 g/m$^2$ to 130 g/m$^2$, and more preferably in a range of 5 g/m$^2$ to 100 g/m$^2$.

Further, it is preferable that the fixing sheet 32 is constituted by the tissue paper whose apparent specific gravity based on JIS P8101 is in a range of 0.1 g/cm$^3$ to 1.3 g/cm$^3$, preferably in a range of 0.2 g/cm$^3$ to 1.2 g/cm$^3$, and more preferably in a range of 0.3 g/cm$^3$ to 1.0 g/cm$^3$.

As the tissue paper used in the exemplary embodiment, paper including fibers made of one or more kinds of plants selected from kouzo, mitsumata and gampi (hereinafter, referred to as "Japanese paper") is preferred.

In addition to the above-described tissue paper, specific examples of Japanese paper include, for example: dan-shi, housho-shi, kyohanagami, yoshinogami, azabugami, minogami, standard-size Japanese writing paper, hankiri, uchiyamagami, hosokawagami, zaogami, nishinouchi, hodomura, tosagami, senka-shi, kasagami, torinoko, goshu-torinoko, kumogami, suminagashi, gasen-shi, mashi, mani-aigami, unryu-shi, rough writing paper, senka-shi, oguragami, gold Japanese paper, usukouzo such as murausukouzo and shibuhikiusukouzo, kyosei-shi, wanp-shi, kakishibugami, konnyakugami and the like. Moreover, Japanese paper for a paper sliding door can also be provided.

It should be noted that, in addition to the fibers made of the above-described plants, Japanese paper may include other fibers as necessary. As other fibers, for example, Manila hemp, wood pulp, straw pulp, waste paper, chemical pulp and synthesized fiber such as rayon can be provided.

In general, and in a narrowest sense, "Japanese paper" is defined as handmade paper made by mixing a viscous agent called "neri" extracted from roots of Abelmoschus manihot or bark of Hydrangea paniculata into raw materials, which are fibers extracted from the above-described plants or waste paper made therefrom, and employing Japan's unique technique referred to as nagashi-suki.

In the exemplary embodiment, including the above-described Japanese paper in the narrowest sense, machine made Japanese paper made by paper machine, or paper that is made of fibers longer than those in foreign paper, the fibers closely entangling with each other, and is thin but persistent and strong (Japanese paper in a wide sense) may also be used.

(Semiconductor Wafer)

Next, as the semiconductor wafer used in the exemplary embodiment, a semiconductor wafer in which a group III nitride semiconductor layer is formed on a substrate of sapphire or the like is taken as an example to describe a configuration thereof. It should be noted that, in the present invention, the semiconductor wafer is not limited thereto; for example, a semiconductor wafer in which a compound semiconductor other than a group III-V nitride semiconductor layer is formed on a substrate can be adopted.

Figure 4:
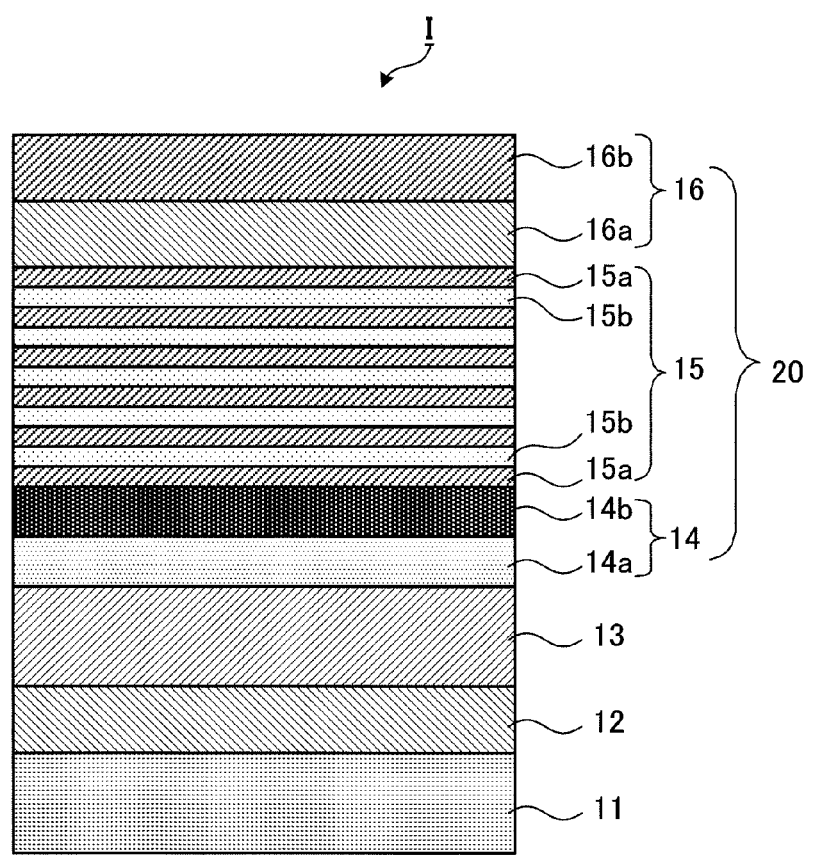
FIG. 4 is a diagram illustrating an example of a laminated layer structure of the semiconductor wafer used in the exemplary embodiment.

FIG. 4 is a diagram illustrating a laminated semiconductor, which is an example of the semiconductor wafer used in the exemplary embodiment. As shown in FIG. 4, in a laminated semiconductor I, on an intermediate layer 12 formed on the substrate 11, a base layer 13 composed of a group III nitride semiconductor and the semiconductor layer 20 in which plural group III semiconductors are laminated are formed. Further, in the semiconductor layer 20, an n-type semiconductor layer 14, a light emitting layer 15 and a p-type semiconductor layer 16 are sequentially laminated.

The n-type semiconductor layer 14 has an n-type contact layer 14a and an n-type cladding layer 14b. The light emitting layer 15 has a structure in which barrier layers 15a and well layers 15b are alternately laminated. In the p-type semiconductor layer 16, a p-type cladding layer 16a and a p-type contact layer 16b are laminated.

In the present invention, as the material constituting the substrate 11, for example, sapphire, carbonized silicon (silicon-carbide: SiC), silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium, tungsten, molybdenum and the like can be provided.

Among these, sapphire and silicon are preferable, and sapphire is most preferable.

There is no particular limitation on the intermediate layer 12 as long as the intermediate layer 12 is composed of any group III nitride compound semiconductor denoted by the general formula of AlGaInN; however, it is preferable to include Al.

As a material used for the base layer 13, the group III nitride including Ga (GaN-based compound semiconductor) is used, and in particular, AlGaN or GaN can be preferably used. The thickness of the base layer 13 is 0.1 μm or more, preferably 1 μm or more, and desirably 15 μm or less.

(N-type Semiconductor Layer 14)

The n-type semiconductor layer 14 is constituted by the n-type contact layer 14a and the n-type cladding layer 14b. As the n-type contact layer 14a, similar to the base layer 13, the GaN-based compound semiconductor is preferably used. Moreover, the gallium nitride-based compound semiconductors which constitute the base layer 13 and the n-type contact layer 14a preferably have the identical composition, and it is preferable to set the total thickness of these layers in a range of 0.2 μm to 20 μm, preferably in a range of 0.5 μm to 15 μm, and more preferably in a range of 1 μm to 12 μm.

The n-type cladding layer 14b is capable of being formed by AlGaN, GaN, GaInN, or the like. The hetero junction structure or the superlattice structure in which the layer is laminated plural times of these structures may also be used. When GaInN is employed, the band gap is preferably larger than that of GaInN of the light emitting layer 15. The thickness of the n-type cladding layer 14b is preferably in a range of 5 nm to 500 nm, and more preferably in a range of 5 nm to 100 nm.

(Light Emitting Layer 15)

In the light emitting layer 15, the barrier layers 15a made of the gallium nitride-based compound semiconductor and the well layers 15b made of the gallium nitride-based compound semiconductor including indium are alternately laminated in a repeated manner, and the barrier layers 15a are provided in such an order to face the n-type semiconductor layer 14 and the p-type semiconductor layer 16, respectively.

For the well layer 15b, as the gallium nitride-based compound semiconductor including indium, a gallium indium nitride such as $Ga_{1-s}In_sN$ ($0<s<0.4$) can be used.

Moreover, as the barrier layer 15a, a gallium nitride-based compound semiconductor, such as $Al_cGa_{1-c}N$ ($0 \leq c \leq 0.3$), which has a larger band gap energy than that of the well layer 15b can be preferably used.

(P-type Semiconductor Layer 16)

The p-type semiconductor layer 16 is constituted by the p-type cladding layer 16a and the p-type contact layer 16b. As the p-type cladding layer 16a, $Al_dGa_{1-d}N$ ($0<d \leq 0.4$) is preferable. The thickness of the p-type cladding layer 16a is preferably in a range of 1 nm to 400 nm, and more preferably in a range of 5 nm to 100 nm.

As the p-type contact layer 16b, a gallium nitride-based compound semiconductor layer including at least $Al_eGa_{1-e}N$ ($0 \leq e < 0.5$) may be provided. The thickness of the p-type contact layer 16b is not particularly limited; however, it is preferably in a range of 10 nm to 500 nm, and more preferably in a range of 50 nm to 200 nm.

(Method for Producing Semiconductor Wafer)

In the exemplary embodiment, generally, the group III nitride semiconductor wafer is produced according to the following procedures. First, on the substrate 11, the intermediate layer 12 made of the group III nitride is formed by activating a metal material and a gas containing a group V element with plasma, and reacting them, and on the intermediate layer 12 thus formed, the base layer 13, the n-type semiconductor layer 14, the light emitting layer 15 and the p-type semiconductor layer 16 are sequentially laminated.

Here, when the group III nitride semiconductor crystal is epitaxially grown on the substrate 11, the intermediate layer 12 is formed on the substrate 11 by forming a layer of a material, which has been activated with plasma and reacted, by use of a sputtering method or the like.

After forming the intermediate layer 12 by the sputtering method, the n-type semiconductor layer 14, the light emitting layer 15 and the p-type semiconductor layer 16 are sequentially formed thereon by the organic metal chemical vapor deposition method (MOCVD).

After forming the intermediate layer 12 and the semiconductor layer 20 on the substrate 11, a transparent anode (not shown) is laminated on the p-type semiconductor layer 16 of the semiconductor layer 20, and an anode bonding pad (not shown) is formed thereon. Further, the wafer 10 is formed in which a cathode (not shown) is provided on an exposed region (not shown) formed in the n-type contact layer 14a of the n-type semiconductor layer 14. After that, the surface-to-be-ground of the wafer 10 is ground and polished to produce a semiconductor wafer.

Thereafter, further, cutting into squares each of which is of 350 μm per side is performed to form a semiconductor light emitting element.

EXAMPLES

Hereinafter, the present invention will be described in detail by taking test examples; however, the present invention is not limited only to these test examples.

Test Example 1

According to the method shown as follows, the semiconductor wafer having the substrate 11 and the semiconductor layer 20 formed on the substrate 11 was produced.

First, four sapphire substrates 11 with a thickness of the order of about 1000 μm and a diameter of 4 inches were prepared per one batch, and as shown in FIG. 4, by use of the MOCVD method, the intermediate layer (buffer layer) 12 composed of MN, the base layer 13 composed of undoped GaN, the n-type semiconductor layer 14, the light emitting layer 15 and the p-type semiconductor layer 16 were sequentially laminated on each substrate 11. It should be noted that the n-type semiconductor layer 14 was formed with the n-type contact layer 14a composed of Si-doped n-type GaN and the n-type cladding layer 14b composed of $In_{0.03}Ga_{0.97}N$.

In the light emitting layer 15, a GaN barrier layer and a $Ga_{0.92}In_{0.08}N$ well layer were laminated six times on the n-type semiconductor layer 14, and finally, the GaN barrier layer was laminated to form the light emitting layer 15 having a multiple quantum well structure. The p-type semiconductor layer 16 was formed with, on the light emitting layer 15, the p-type cladding layer 16a composed of Mg-doped AlGaN and the p-type contact layer 16b composed of Mg-doped p-type GaN.

Next, on the p-type semiconductor layer 16, the translucent anode composed of ITO (indium tin oxide ($In_2O_3$—$SnO_2$)) was laminated by the sputtering method, and the anode bonding pad was formed thereon. Further, the exposed region was provided on the n-type contact layer 14a of the n-type semiconductor layer 14 to form the cathode, and thereby the wafer 10 was prepared. Here, as a result of measuring the warping in the wafer 10, the warping was in a range of 30 μm to 150 μm.

Next, as shown in FIG. 1A, the 4-inch wafer 10 thus prepared was placed on the carrier plate of the grinder, with the back surface thereof facing upward, via the fixing sheet made of tissue paper and the fixing wax, and then the carrier plate was heated to soften the fixing wax. In the state where the fixing wax was softened, the wafer 10 was brought into pressure-contact from the back surface side thereof by the air bag, and thereby the wafer 10 was bonded onto the carrier plate. Continuously, while being pressurized by the presser, the wafer 10 was cooled and fixed onto the carrier plate. On this occasion, the wafer 10 was pressurized via the rubber-like elastic body sheet made of silicone rubber. Next, the back surface of the wafer 10 was ground while the back surface of the wafer 10 fixed onto the carrier plate was brought into pressure-contact with the grinding plate of the grinder and was rotated.

As a result of producing the semiconductor wafers in plural batches under such conditions, the grinding and polishing of the back surface of the wafer 10 were excellently performed, a thickness defect was not generated, and the semiconductor wafer was excellently produced. Moreover, no cracking occurred in the wafer 10.

Test Example 2

Except that a sapphire substrate having a diameter of 6 inches is used as the substrate to change the warping amount of the wafer 10 into a range of 50 μm to 250 μm, the semiconductor wafer was produced under the same conditions as in Test Example 1. As a result of producing the semiconductor wafer under such conditions, the grinding and polishing of the back surface of the wafer 10 were excellently performed, the thickness defect was not generated, and the semiconductor wafer was excellently produced. Moreover, no cracking occurred in the wafer 10.

Test Example 3

Except that a step was changed not to use the rubber-like elastic body sheet, the semiconductor wafer was produced under the same conditions as in Test Example 2. As a result, though the thickness defect in the wafer 10 of the order of 5% was generated, no cracking occurred in the wafer 10. The reason why the slight thickness defect in the wafer 10 (out of specification) was generated is considered to be occurrence of variation in the application of pressure to the plural wafers 10 due to no use of the rubber-like elastic body sheet.

Test Example 4

Except that a silicon wafer having a diameter of 6 inches is used as the substrate to change the warping amount of the wafer 10 smaller compared to the wafer 10 used in the above-described Test Examples 1 to 3 (in a range of +30 μm to −30 μm) and that the rubber-like elastic body sheet is not used, the semiconductor wafer was produced under the same conditions as in Test Example 1. As a result of producing the semiconductor wafers in plural batches under such conditions, the grinding and polishing of the back surface of the wafer were excellently performed, and the thickness defect in the wafer 10 was not generated.

Test Example 5

Except that a silicon wafer having a diameter of 4 inches is used as the substrate to change the warping amount of the wafer in a range of +30 μm to −30 μm and that the wafer 10 is bonded onto the carrier plate without using the air bag, the semiconductor wafer was produced under the same conditions as in Test Example 1. As a result of producing the semiconductor wafers in plural batches under such conditions, the thickness defect in the wafer 10 of about 10% occurred to be out of specification.

TABLE 1

| | Type of Substrate | Diameter of Substrate (inch) | Warping Amount of Wafer (μm) | Pressure-contact Bonding Step Using Air Bag | Rubber-like Elastic Body Sheet | Evaluation |
|---|---|---|---|---|---|---|
| Test Example 1 | Sapphire | 4 | 30 to 150 | Employed | Present | Excellent |
| Test Example 2 | Sapphire | 6 | 50 to 250 | Employed | Present | Excellent |
| Test Example 3 | Sapphire | 6 | 50 to 250 | Employed | Absent | Slightly Excellent |
| Test Example 4 | Silicon | 6 | −30 to 30 | Employed | Absent | Excellent |
| Test Example 5 | Silicon | 4 | −30 to 30 | Not Employed | Absent | Not Excellent |

From the results shown in Table 1, in the method of producing the semiconductor wafer, it can be learned that, even in a case where the semiconductor wafer has warping, the semiconductor wafer can be ground to have a predetermined thickness without causing the thickness defect (out of specification) in the semiconductor wafer by bringing the wafer 10 into pressure-contact by the air bag to bond thereof when the wafer 10 is fixed onto the carrier plate.

Reference Signs List
10 . . . Wafer
11 . . . Substrate
12 . . . Intermediate layer
13 . . . Base layer
14 . . . N-type semiconductor layer
15 . . . Light emitting layer
16 . . . P-type semiconductor layer
20 . . . Semiconductor layer
30 . . . Heating stage
30*h* . . . Heater
31 . . . Carrier plate (fixing plate)
32 . . . Fixing sheet
33*a*, 33*b* . . . fixing wax
34 . . . Grinding plate
40 . . . Pressure-contact member
44 . . . Elastic member
45 . . . Pressure chamber
46 . . . Pressure-contact unit
50 . . . Pressurized fluid supply unit
60 . . . Pressurized fluid discharge unit
70 . . . Press stage
80 . . . Pressurizing member
81 . . . Rubber-like elastic body sheet

The invention claimed is:

1. A method for producing a semiconductor wafer, comprising:
   a placing step in which a semiconductor wafer including a substrate and a semiconductor layer formed on the substrate is placed, with a surface-to-be-ground of the semiconductor wafer facing upward, on a fixing plate of a grinder via a fixing wax;
   a heating step in which the fixing plate on which the semiconductor wafer is placed in the placing step is heated to soften the fixing wax;
   a pressure-contact bonding step in which, in a state where the fixing wax is softened in the heating step, the semiconductor wafer is brought into pressure-contact from a side of the surface-to-be-ground by an air bag and bonded onto the fixing plate;
   a fixing step in which the fixing plate is cooled while the semiconductor wafer bonded onto the fixing plate in the pressure-contact bonding step is pressurized, and thereby the semiconductor wafer is fixed onto the fixing plate by curing the fixing wax; and
   a grinding step in which the surface-to-be-ground of the semiconductor wafer fixed onto the fixing plate is rotated while being in pressure-contact with a grinding plate of the grinder to be ground,
   wherein, in the placing step, the semiconductor wafer is placed on the fixing plate via a fixing sheet and the fixing wax, and
   wherein the fixing sheet is configured with machine made Japanese paper or a nonwoven fabric.

2. The method for producing a semiconductor wafer according to claim 1, wherein, in the fixing step, a rubber-like elastic body sheet is placed on the surface-to-be-ground of the semiconductor wafer, and the semiconductor wafer is pressurized via the rubber-like elastic body sheet.

3. The method for producing a semiconductor wafer according to claim 1, wherein the substrate is selected from sapphire or silicon.

4. The method for producing a semiconductor wafer according to claim 1, wherein the semiconductor layer of the semiconductor wafer is formed by laminating an n-type semiconductor layer, a light emitting layer and a p-type semiconductor layer that include a group III nitride semiconductor.

5. The method for producing a semiconductor wafer according to claim 1, wherein, in the pressure-contact bonding step, a load is applied to the softened fixing wax on the fixing plate from the center portion toward the peripheral portion of the fixing wax, such that the fixing wax on the fixing plate extends substantially uniformly and a part of the fixing wax spreads so as to extend off the peripheral portion of the semiconductor wafer.

6. The method for producing a semiconductor wafer according to claim 1, wherein, the machine made Japanese paper is a paper being compliant with Japanese Industrial Standards (JIS) P4500.

7. The method for producing a semiconductor wafer according to claim 1, wherein the machine made Japanese paper includes fibers made of one or more kinds of plants selected from kouzo, mitsumata and gampi.

8. The method for producing a semiconductor wafer according to claim 1, wherein the fixing sheet is configured with machine made Japanese paper including fibers made of one or more kinds of plants selected from kouzo, mitsumata and gampi.

* * * * *